United States Patent
Wang

(10) Patent No.: US 10,641,912 B1
(45) Date of Patent: May 5, 2020

(54) "4H" X-RAY CAMERA

(71) Applicant: LOS ALAMOS NATIONAL SECURITY, LLC, Los Alamos, NM (US)

(72) Inventor: Zhehui Wang, Los Alamos, NM (US)

(73) Assignee: TRIAD NATIONAL SECURITY, LLC, Los Alamos, NM (US)

( * ) Notice: Subject to any disclaimer, the term of this patent is extended or adjusted under 35 U.S.C. 154(b) by 0 days.

(21) Appl. No.: 15/622,557

(22) Filed: Jun. 14, 2017

Related U.S. Application Data

(60) Provisional application No. 62/350,636, filed on Jun. 15, 2016.

(51) Int. Cl.
*G01T 1/24* (2006.01)
*H01L 21/50* (2006.01)
*H05K 3/30* (2006.01)
*H01L 21/02* (2006.01)
*G01T 1/29* (2006.01)
*H01L 31/0304* (2006.01)

(52) U.S. Cl.
CPC ............ *G01T 1/2928* (2013.01); *G01T 1/247* (2013.01); *H01L 31/0304* (2013.01)

(58) Field of Classification Search
CPC ..... G01T 1/2928; G01T 1/247; G01T 1/1614; H01L 31/0304
USPC .................................................. 250/370.09
See application file for complete search history.

(56) References Cited

U.S. PATENT DOCUMENTS

| | | | | |
|---|---|---|---|---|
| 5,594,253 A | * | 1/1997 | Bueno ..................... | G01T 1/201 250/367 |
| 5,629,524 A | * | 5/1997 | Stettner ................. | G01T 1/2018 250/370.09 |
| 5,665,970 A | * | 9/1997 | Kronenberg ............. | G01T 1/18 250/336.1 |
| 6,285,739 B1 | | 9/2001 | Rudin et al. | |
| 6,553,092 B1 | | 4/2003 | Mattson et al. | |
| 8,120,683 B1 | * | 2/2012 | Tumer ............. | H01L 27/14634 250/370.09 |
| 8,637,831 B2 | | 1/2014 | Hayden et al. | |
| 9,482,630 B2 | | 11/2016 | Wang et al. | |
| 2005/0173641 A1 | | 8/2005 | Unger et al. | |
| 2008/0069297 A1 | | 3/2008 | Hoffman | |
| 2009/0074281 A1 | * | 3/2009 | McFarland ............ | A61B 6/032 382/131 |
| 2009/0290680 A1 | * | 11/2009 | Tumer .................... | G01T 1/247 378/62 |
| 2010/0002111 A1 | * | 1/2010 | Yourlo ................. | H04N 5/3559 348/294 |
| 2010/0116999 A1 | * | 5/2010 | Tumer .................... | G01T 1/247 250/370.13 |
| 2010/0158192 A1 | * | 6/2010 | Friederich ............ | G01V 5/0016 378/57 |
| 2011/0116596 A1 | * | 5/2011 | Sommer, Jr. ........... | G01N 23/06 378/53 |
| 2011/0182406 A1 | * | 7/2011 | Nelson ................. | A61B 6/4216 378/62 |

(Continued)

Primary Examiner — Taeho Jo
(74) Attorney, Agent, or Firm — Lewis Roca Rothgerber Christie LLP

(57) ABSTRACT

A 4H X-ray camera includes a high speed, high atomic number (Z), high spatial resolution sensor for sensing X-rays having energy over 30 keV and high speed readout electronics, and the high speed, high atomic number (Z), high spatial resolution sensor is coupled to the high speed readout electronics.

20 Claims, 8 Drawing Sheets

(56) References Cited

U.S. PATENT DOCUMENTS

| | | | |
|---|---|---|---|
| 2011/0248765 A1* | 10/2011 | Tumer | G01T 1/2985 327/306 |
| 2013/0026379 A1* | 1/2013 | Lohse | H04N 5/32 250/370.12 |
| 2013/0058452 A1* | 3/2013 | Levene | G01T 1/2018 378/19 |
| 2013/0292574 A1 | 11/2013 | Levene et al. | |
| 2013/0334433 A1* | 12/2013 | Spartiotis | H01L 27/14634 250/370.09 |
| 2015/0312501 A1* | 10/2015 | Fahim | H01L 27/14661 348/294 |
| 2016/0231454 A1* | 8/2016 | Morton | G21K 1/025 |
| 2017/0006236 A1* | 1/2017 | French | H01L 27/14609 |
| 2017/0269237 A1* | 9/2017 | Cao | H01L 27/14609 |
| 2018/0017687 A1* | 1/2018 | Cao | G01T 1/2928 |

\* cited by examiner

"4H" X-RAY CAMERA

CROSS-REFERENCE TO RELATED APPLICATION(S)

The present application claims priority to and the benefit of U.S. Provisional Application No. 62/350,636, filed Jun. 15, 2016, entitled "4H" X-RAY CAMERA, the entire content of which is incorporated herein by reference.

STATEMENT REGARDING FEDERALLY SPONSORED RESEARCH OR DEVELOPMENT

This invention was made with government support under Contract No. DE-AC52-06NA25396 awarded by the United States Department of Energy and Los Alamos National Security, LLC for the operation of Los Alamos National Laboratory. The government has certain rights in the invention.

BACKGROUND

1. Field

Embodiments of the present invention relate to X-ray cameras.

2. Description of the Related Art

Traditional single-line-of-sight X-ray cameras are limited to less than 10 MHz frame-rate, none are "4H" technology—High-Z (atomic number Z>30), High-resolution (less than 200 micron pixel size), High-speed (above 100 MHz), and High-energy (above 30 keV in photon energy). Silicon-based high-speed cameras are "Low-Z" and traditionally work best for "Low-energy" (less than 20 keV). GaAs, Ge, and CZT-based X-ray cameras are limited in speed (<1 MHz). Scintillator-based X-ray cameras are indirect detectors with limited spatial resolution.

SUMMARY

Aspects of embodiments of the present invention provide a 4H X-ray camera including high-Z (atomic number greater than 30) sensors and high-speed readout electronics. (4H refers to High-Z, High-resolution e.g., less than 200 micron pixel size, High-speed e.g., above 100 MHz, and High-energy e.g., above 30 keV in photon energy).

According to an embodiment of the present invention, a 4H X-ray camera includes a high speed, high atomic number (Z), high spatial resolution sensor, and high speed readout electronics, wherein the high speed, high atomic number (Z), high spatial resolution sensor may be coupled to the high speed readout electronics.

The high speed, high atomic number (Z), high spatial resolution sensor may include high-resistivity Chromium-doped GaAs sensor arrays.

The high speed readout electronics may include nano-second Application Specific Integrated Circuits (ASICs).

The high speed, high atomic number (Z), high spatial resolution sensor may be coupled to the high speed readout electronics utilizing bump bonding.

The high speed, high atomic number (Z), high spatial resolution sensor may be coupled to the high speed readout electronics utilizing wire bonding.

The high speed, high atomic number (Z), high spatial resolution sensor may be coupled to the high speed readout electronics utilizing 3D integration technology.

The high speed, high atomic number (Z), high spatial resolution sensor may include a material with at least one element with an atomic number greater than thirty.

The 4H X-ray camera may further include a second sensor in line with the high speed, high atomic number (Z), high spatial resolution sensor, wherein the high speed readout electronics are divided into four parts, each part being coupled to a respective half of one of either the high speed, high atomic number (Z), high spatial resolution sensor or the second sensor.

The 4H X-ray camera may further include a first tier including the high speed, high atomic number (Z), high spatial resolution sensor, the second sensor, and the high speed readout electronics; and a second tier including a third sensor, a fourth sensor, and second high speed readout electronics, the third sensor and the fourth sensor being in line with the high speed, high atomic number (Z), high spatial resolution sensor and the second sensor.

The high speed, high atomic number (Z), high spatial resolution sensor may be coupled to the high speed readout electronics utilizing 3D integration technology.

According to an embodiment of the present invention, a 4H X-ray camera includes: a plurality of tiers, each tier including: a high speed, high atomic number (Z), high spatial resolution sensor for sensing X-rays having energy over 30 key; and high speed readout electronics, wherein the high speed, high atomic number (Z), high spatial resolution sensor is coupled to the high speed readout electronics.

Each of the high speed, high atomic number (Z), high spatial resolution sensors may include high-resistivity Chromium-doped GaAs sensor arrays.

Each of the high speed readout electronics may include nano-second Application Specific Integrated Circuits (ASICs).

Each of the high speed, high atomic number (Z), high spatial resolution sensors may include a material with at least one element with an atomic number greater than thirty.

Each of the tiers may further include a second sensor in line with the high speed, high atomic number (Z), high spatial resolution sensor, wherein the high speed readout electronics, of each of the tiers, is divided into four parts, each part being coupled to a respective half of one of the high speed, high atomic number (Z), high spatial resolution sensor or the second sensor.

The high speed, high atomic number (Z), high spatial resolution sensor and the second sensor may be coupled to the high speed readout electronics, within each of the tiers, utilizing transmission lines.

The high speed, high atomic number (Z), high spatial resolution sensor, in each of the tiers, may be in-line with its corresponding high speed readout electronics. Each of the plurality of tiers may be in-line with each other of the plurality of tiers.

Each of the high speed, high atomic number (Z), high spatial resolution sensors may be 100 μm thick.

Each of the high speed readout electronics may be 100 μm thick.

According to an embodiment of the present invention, a method of capturing an X-ray image utilizing a 4H X-ray camera may include receiving an X-ray with energy over 30 keV at a high speed, high atomic number (Z), high spatial resolution sensor of the 4H X-ray camera; generating and transferring an electric signal from the high speed, high atomic number (Z), high spatial resolution sensor to high speed readout electronics of the 4H X-ray camera; and generating an image based on the electric signal received at the high speed readout electronics, wherein the image has a resolution having a pixel size of 200 microns or less, wherein an operating speed of the 4H X-ray camera is 100 MHZ or greater, and wherein the high speed, high atomic number (Z), high spatial resolution sensor comprises a material with an atomic number greater than thirty.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Traditional single-line-of-sight X-ray cameras are limited to less than 10 MHz frame-rate, none are "4H" technology—High-Z (atomic number greater than 30), High-resolution (less than 200 micron pixel size), High-speed (above 100 MHz), and High-energy (above 30 keV in photon energy). Silicon-based high-speed cameras are "Low-Z" and "Low-energy". GaAs, Ge, and CZT-based X-ray cameras are limited in speed (<1 MHz). Scintillator-based X-ray cameras are indirect detectors with limited spatial resolution.

Single-line-of-sight X-ray cameras are set up such that an object to be X-rayed is placed between the X-ray source and the X-ray camera. X-rays are then emitted from the source and pass through the object and are incident upon the X-ray camera to be absorbed, Compton scattered, etc.

Embodiments of the present invention provide X-ray imaging systems that can achieve high X-ray detection efficiency, fast detection speed, and spectroscopic or energy separation of different X-ray photons simultaneously. X-ray imaging systems according to embodiments of the present invention are built upon two major subsystems: direct X-ray sensing utilizing semiconductors; and data collection and processing utilizing application specific integrated circuits (ASICs).

Embodiments of the present invention provide flexibility in choosing different semiconductor sensors with a variety of ASIC chips and, as such, a large number of X-ray imaging camera configurations are possible according to embodiments of the present invention.

According to embodiments of the present invention, a new performance regime in X-ray imaging, called '4H' for High-Z (Z>30), High-resolution (less than 200 micron pixel size), High-speed (above 100 MHz), and High-energy (above 30 keV in photon energy), is now accessible. For compound semiconductors, at least one type of atom in the semiconductor may have an atomic number greater than 30.

Figure 1:
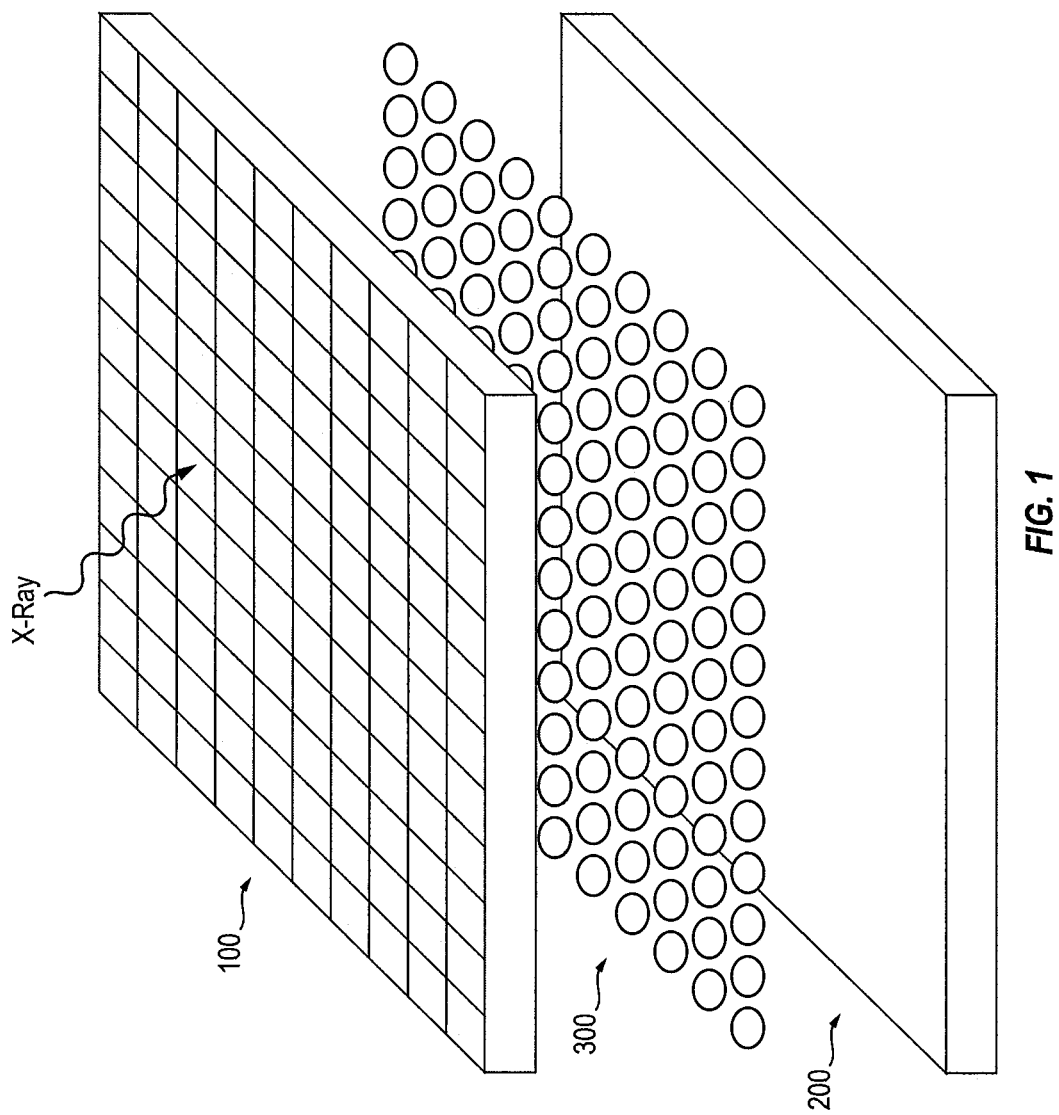
FIG. 1 is an exploded perspective view of a 4H X-ray camera according to an embodiment of the present invention, based on bump bonding technology.

FIG. 1 is an exploded perspective view of a 4H X-ray camera according to an embodiment of the present invention. The 4H X-ray camera of FIG. 1 includes a high speed sensor 100, high-speed readout electronics 200, and bump bonding 300.

Embodiments of the present invention may combine high-Z sensors such as GaAs with faster ASIC chips (such as the HIPPOGRIFF chip built by Sandia National Laboratory, New Mexico, which has a few ns of response time) to achieve '4H' performance.

Embodiments of the present invention may provide for single photon counting and image de-blurring (e.g., by making every photon count). Bump bonding less than 50 microns may use a specific solder, such as indium, and may have a one to one ASIC to sensor ratio, but the present invention is not limited thereto and a multiple to one, one to multiple, or multiple to multiple ASIC to sensor ratio may be used.

According to the embodiment of FIG. 1, the high speed sensor 100 may be coupled to the high-speed readout electronics 200 utilizing the bump bonding 300 as solder (e.g., indium or other metals), but the present invention is not limited thereto, and any suitable connecting method may be used to connect the high speed sensor 100 to the high-speed readout electronics 200.

When X-rays are absorbed by the high speed sensor 100, many secondary electron-holes are produced (by the photoelectric effect). The electrons and holes are separated by an externally applied electric field and then drift to the high-speed readout electronics 200 via the bump bonding 300.

According to embodiments of the present invention, the high speed sensor 100 may include a high-Z sensor. The high speed sensor 100 (e.g., the high-Z sensor) may include high-resistivity detector-grade Chromium-doped GaAs sensor arrays, but the present invention is not limited thereto. The high-speed readout electronics 200 may include nanosecond Application Specific Integrated Circuits (ASICs), but the present invention is not limited thereto.

Figure 2:
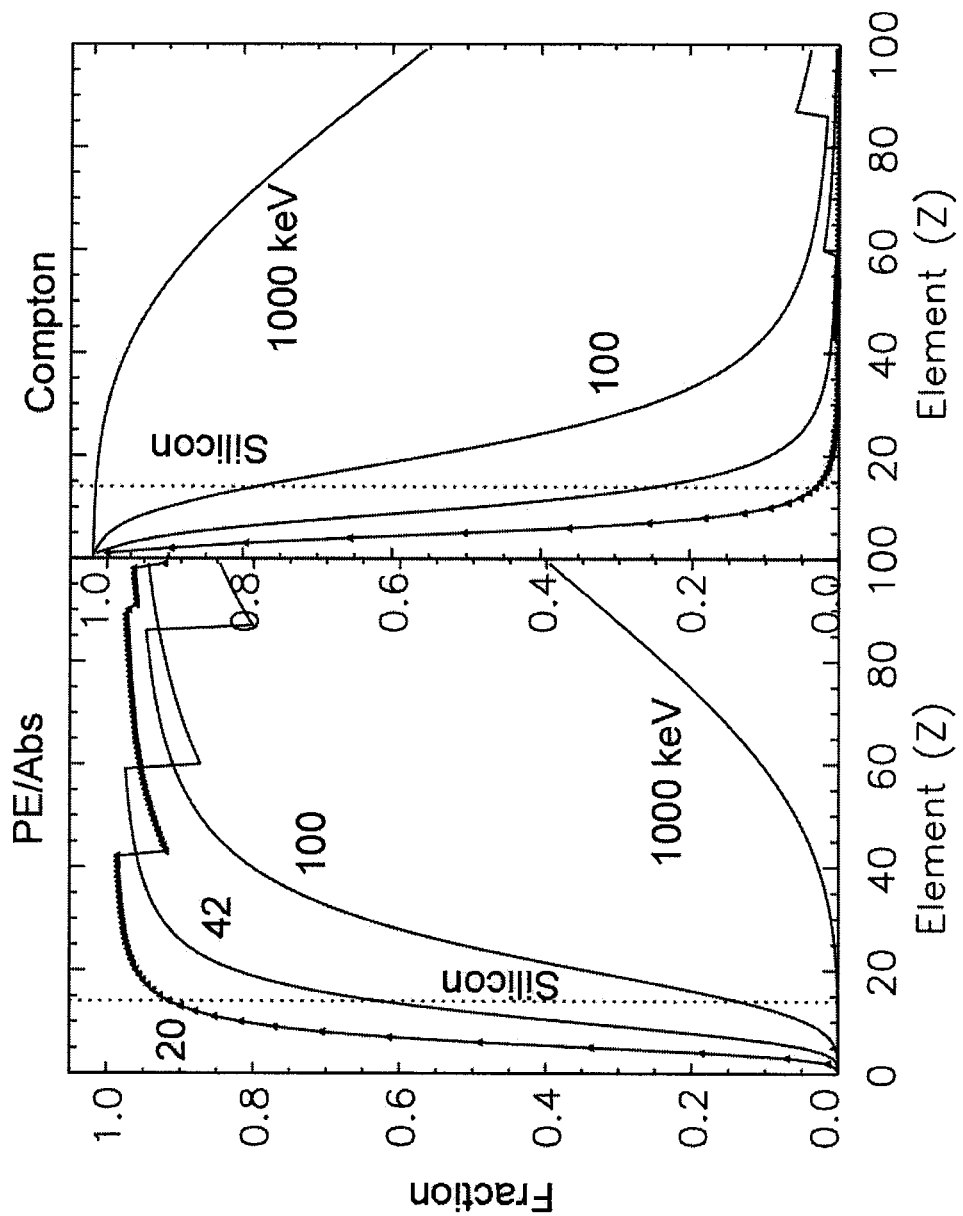
FIG. 2 shows two graphs illustrating fractions of photoelectric absorption and Compton scattering as a function of atomic element number (Z).

FIG. 2 shows two graphs illustrating fractions of photoelectric absorption (left) and Compton scattering (right) as a function of atomic element number (Z). FIG. 2 shows X-ray energies of 20 keV (20), 42 keV (42), 100 keV (100), and 1000 keV (1000). Further, Z=14 (the atomic number for silicon) is shown as a vertical dotted line.

In FIG. 2, the horizontal axis represents elemental atomic numbers (Z) and the vertical axis represents the fraction of X-rays that are absorbed (left) or scattered via the Compton effect (right). Typically, in X-ray cameras, a high photoelectric absorption fraction and low Compton fraction produces a high resolution image. A decrease in the photoelectric absorption factor or an increase in the Compton factor may degrade the image resolution. A 4H X-ray camera according to embodiments of the present invention is capable of generating an image with a resolution including a pixel size of 200 microns or smaller.

As can be seen in FIG. 2, the absorption fraction and the Compton fraction vary as a function of energy (keV) as well as the atomic number of the sensor (Z). In general, the higher the Z value of the sensor, the higher the fraction of photoelectric absorption and the lower the fraction of Compton scattering.

According to some embodiments of the present invention, GaAs sensors (high-Z, high-resolution) may be used to achieve "4H" (targeting 100 MHz or above frame-rate equivalent, high-speed). The effects of Compton scattering may be low enough that they can effectively be ignored when utilizing GaAs for 42 keV X-rays (high-energy). The Compton fraction for 42 keV X-ray photons in Ge and GaAs is about 2.3%, which may be negligible in many applications.

According to an embodiment of the present invention, a method of capturing an X-ray image utilizing a 4H X-ray camera may include receiving an X-ray with energy over 30 keV at a high speed, high atomic number (Z) sensor or a high speed, high atomic number (Z), high spatial resolution sensor of the 4H X-ray camera; transferring an electric signal from the high speed, high atomic number (Z), high spatial resolution sensor to high speed readout electronics of the 4H X-ray camera; and generating an image based on the electric signal received at the high speed readout electronics, wherein the image has a resolution having a pixel size of 200 microns or less, wherein an operating speed of the 4H X-ray camera is 100 MHZ or greater, and wherein the high speed, high atomic number (Z), high spatial resolution sensor comprises a material with an atomic number greater than thirty.

Embodiments of the present invention may enable new experimental capabilities in existing light sources such as the Advanced Photon Source (APS), the Linac Coherent Light Source (LCLS), and the National Synchrotron Light Source II (NSLS-II). Further, embodiments of the present invention may provide new capabilities in industrial and medical settings as well as research settings.

Figure 3:
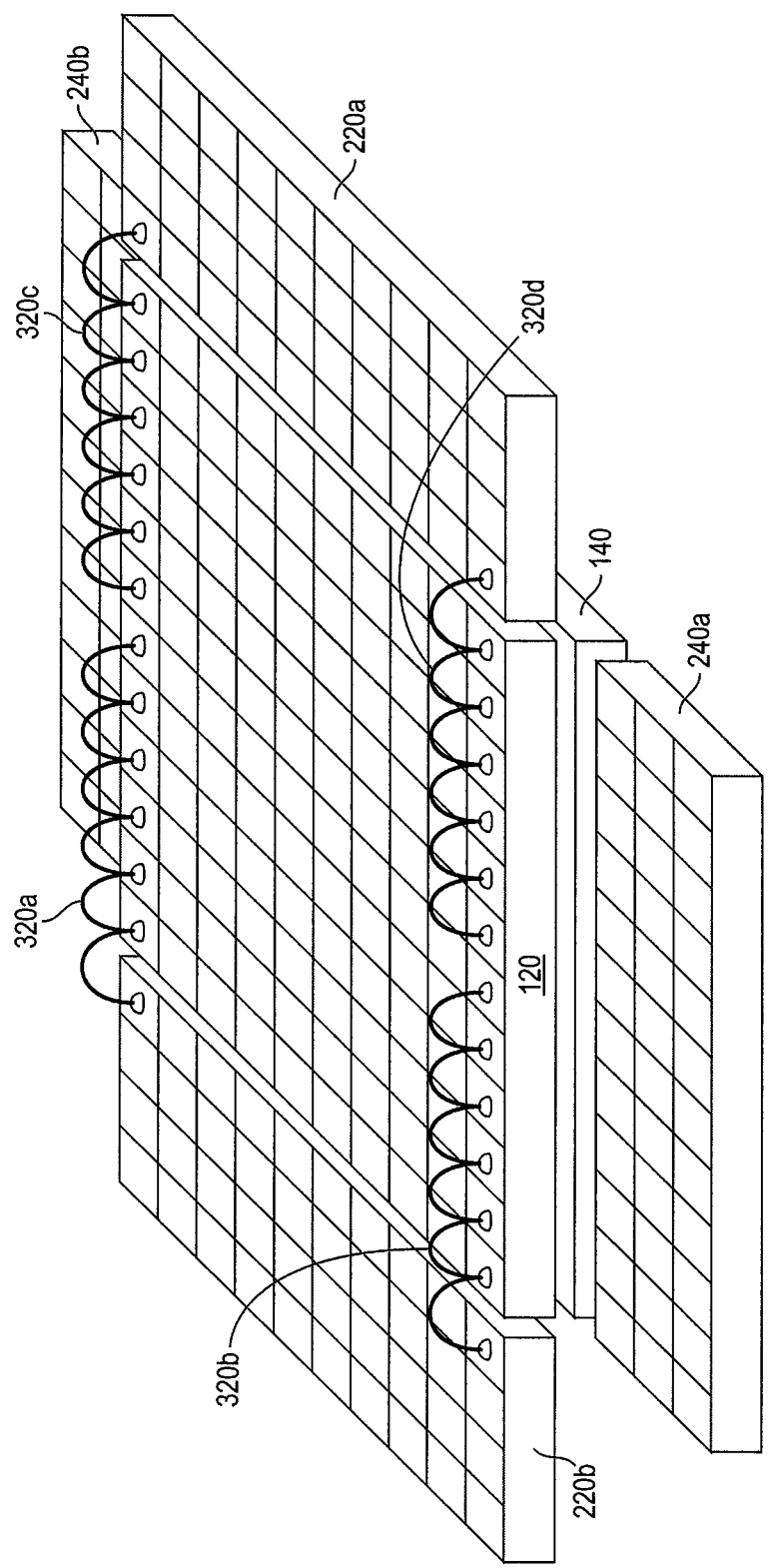
FIG. 3 is an exploded perspective view of a 4H X-ray camera according to another embodiment of the present invention, based on wire-bonding or ultrafine wire bonding technology.

FIG. 3 is an exploded perspective view of a 4H X-ray camera according to another embodiment of the present invention.

Referring back to FIG. 1, both the sensor and the ASIC chip are in the path of incoming X-rays, which are roughly at normal incidence with respect to the camera surface. In FIG. 1, overall camera speed may be limited by the speed of the ASIC chip, this may be a significant limitation since only very few high-speed chips such as HIPPOGRIFF exists and this can limit the number of feasible applications.

Referring to FIG. 3, the ASIC may be moved to the side of the sensor. As shown in FIG. 3, the signal from half of the pixels in each row may be transmitted through a common transmission line to an ASIC quarter or portion. The 4H X-ray camera of FIG. 3 includes at least two sensors (e.g., top sensor 120 and bottom sensor 140) and at least four ASICs (e.g., first top ASIC 220a, second top ASIC 220b, first bottom ASIC 240a, and second bottom ASIC 240b). The ASICs may also be referred to as ASIC quarters or ASIC portions. The 4H X-ray camera further includes wire bonding (e.g., first wire bonding 320a, second wire bonding 320b, third wire bonding 320c, and fourth wire bonding 320d). While the present embodiment shows two sensors and four ASICs or ASIC portions, the present invention is not limited thereto and more or less than two sensors and more or less than four ASICs may be included. Further, while the present embodiment utilizes wire bonding, and suitable connections for connecting the sensor to the ASIC may be utilized.

While the embodiment in FIG. 3 shows that the signal from half of the pixels in each row is transmitted through a common transmission line to one of the ASICs 220a, 220b, 240a, or 240b, the present invention is not limited thereto and the signals from individual pixels may be transmitted separately. When the signals from individual pixels are transmitted separately, some insulation over each transmission line may be used to prevent accidental crossing of different transmission lines. Such insulation may be applied over the bonding wires ahead of the bonding procedure.

The transmission line may be wire-bonded at each end, one end at the pixel location, the other at the ASIC quarter. Industrially ultra-fine pitch wire bonding procedures may be used. One example of such a procedure is offer by Kulicke & Soffa Power series, which can bond to pitches as low as 40 microns or less.

Another feature of the embodiment in FIG. 3 is that it allows a second (bottom) sensor layer to be placed below the first (top) layer to form the double layer configuration. For the bottom layer, the ASICs and wire bonding direction may be rotated by 90 degrees with respect to the top layer. The top and bottom layers can also use different materials, for example, the top layer can be made of silicon, the bottom of GaAs (or another high-Z material). The two sensors may also have different thicknesses. In this way, a high-Z sensor and a low-Z sensor may be used in the same X-ray camera.

Utilizing different materials and/or thicknesses may allow spectroscopic or energy measurements of different X-rays. The low energy X-rays may be stopped in the top layer while the higher energy X-rays may be deposited in the bottom layer.

Having a double layer may further enhance the mechanical rigidity of the camera when the sensors are thinner than 100 micron, which may be useful in some embodiments.

In some embodiments, the interface in-between the top and bottom layers may be used to apply a negative bias. This bias may be sufficient to push X-ray electric signals to the top or bottom surface.

In some embodiments, the number of storages (typically achieved by utilizing several capacitors) may not be limited by the surface area of the camera.

Surface area may be a limiting factor in some X-ray cameras, because storage capacitors are typically the largest component inside an ASIC chip and therefore the limiting factor in the number of images can be stored for each pixel. For example, for a traditional X-ray camera with a pixel size of 25 to 30 microns, the number of storage capacitor may be limited to less than 5.

In some embodiments, multiple image storage may use a fast transistor switch, which functions as the receiver of each signal from a transmission line. Each fast transistor can serve multiple storage capacitors.

According to embodiments of the present invention, when signal amplification is desired, an amplifier may be inserted in-between the fast transistor switch and each capacitor.

In some embodiments, the speed of the ASIC may not be a limiting factor in the overall speed of the camera, since the fast transistor switch can serve multiple storage capacitors, and each capacitor can be further processed by a relatively slow ASIC chip without affecting the overall speed of the camera.

Figure 4:
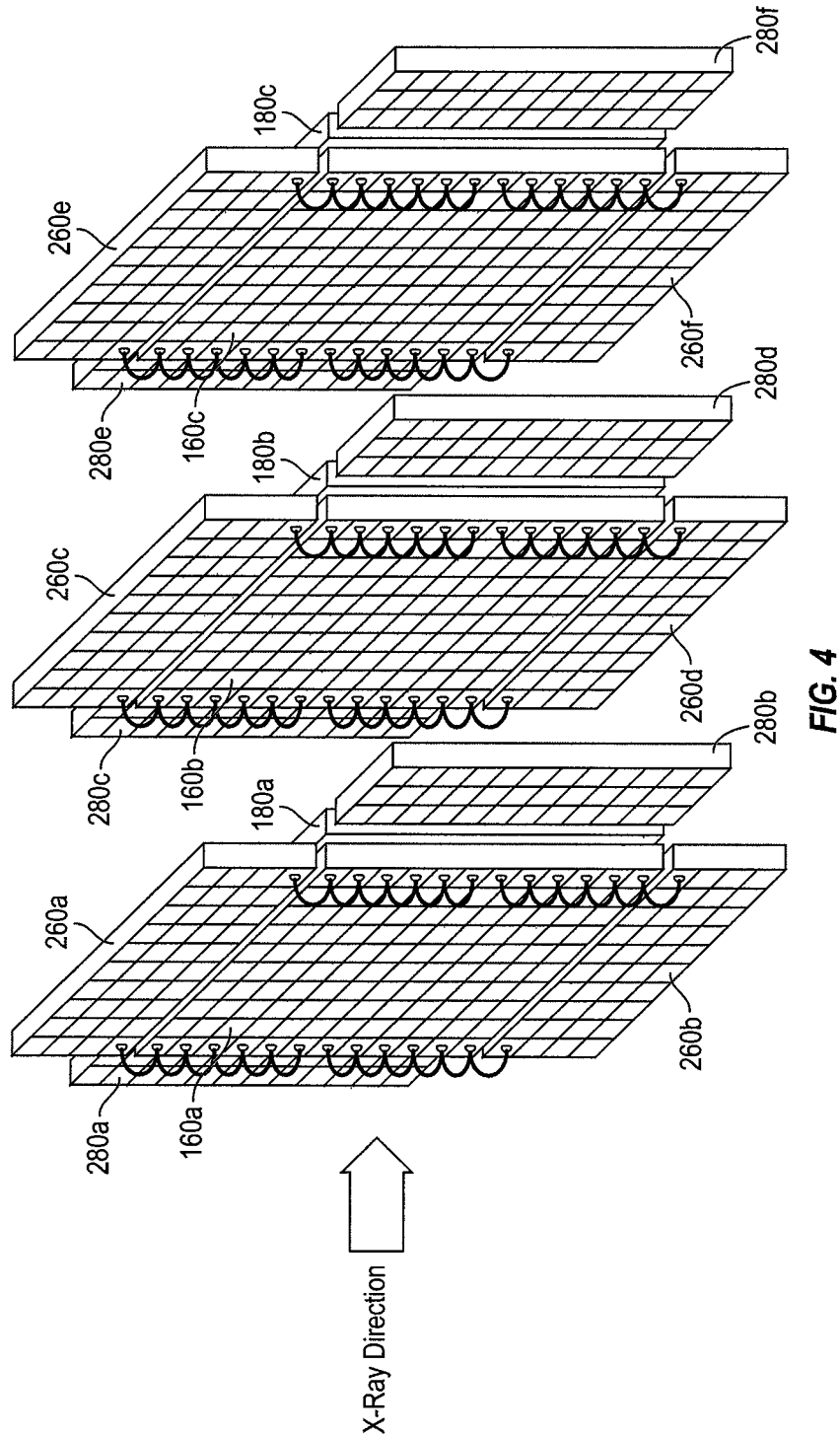
FIG. 4 is an exploded perspective view of a 4H X-ray camera according to another embodiment of the present invention, with a multiple layer extension of FIG. 3.

FIG. 4 is an exploded perspective view of a 4H X-ray camera according to another embodiment of the present invention.

According to some embodiments of the present invention, sensor thickness may be a limiting factor in the overall X-ray camera speed.

In FIG. 4, tiers of thin sensors may be used. As can be seen in FIG. 4, multiple tiers (e.g., First tier, Second tier, and Third tier), each including two or more sensors, may be placed in a stacked arrangement.

Each tier of FIG. 4 may include at least two sensors (e.g., first top sensor 160a and first bottom sensor 180a, second top sensor 160b and second bottom sensor 180b, third top sensor 160c and third bottom sensor 180c, and/or fourth top sensor 160d and fourth bottom sensor 180d) and, at least four ASICs (e.g.: first top ASIC 260a, second top ASIC 260b, first bottom ASIC 280a, and second bottom ASIC 280b; third top ASIC 260c, fourth top ASIC 260d, third bottom ASIC 280c, and fourth bottom ASIC 280d; fifth top ASIC 260e, sixth top ASIC 260f; fifth bottom ASIC 280e, and sixth bottom ASIC 280f). The ASICs may also be referred to as ASIC quarters or ASIC portions. Each tier of FIG. 4 further includes wire bonding. While the present embodiment shows two sensors and four ASICs or ASIC portions per tier, the present invention is not limited thereto and more or less than two sensors and more or less than four ASICs may be included. In addition, while the present embodiment utilizes 3 tiers, the present invention is not limited thereto and more or less tiers may be used (e.g., 10 tiers). Further, while the present embodiment utilizes wire bonding, and suitable connections for connecting the sensor to the ASIC may be utilized.

The tiered structure may allow for use of thinner sensors while still providing a high efficiency (i.e., while still capturing a high percentage of the X-rays). The efficiency of the X-ray camera according to the embodiment of FIG. 4 may be comparable or even higher than the efficiency of the X-ray camera according to the embodiments of FIGS. 1 and/or 3, while providing thinner and faster sensors, depending on the total sensor thickness of all the layers.

The top sensors may be high speed, high atomic number (Z), high spatial resolution sensors and the second sensors may be a low-Z sensor.

According to an embodiment, each of the top sensors and each of the second sensors may be coupled to the high speed readout electronics, within each of the tiers, utilizing 3D integration technologies (e.g., see 3D integration technologies offered by Tezzaron Semiconductor Corporation).

According to an embodiment of the present invention a 4H X-ray camera may include a high-Z (atomic number greater than 30) sensors and high-speed readout electronics. (4H refers to High-Z, High-resolution e.g., less than 200 micron pixel size, High-speed e.g., above 100 MHz, and High-energy e.g., above 30 keV in photon energy).

Figure 5:
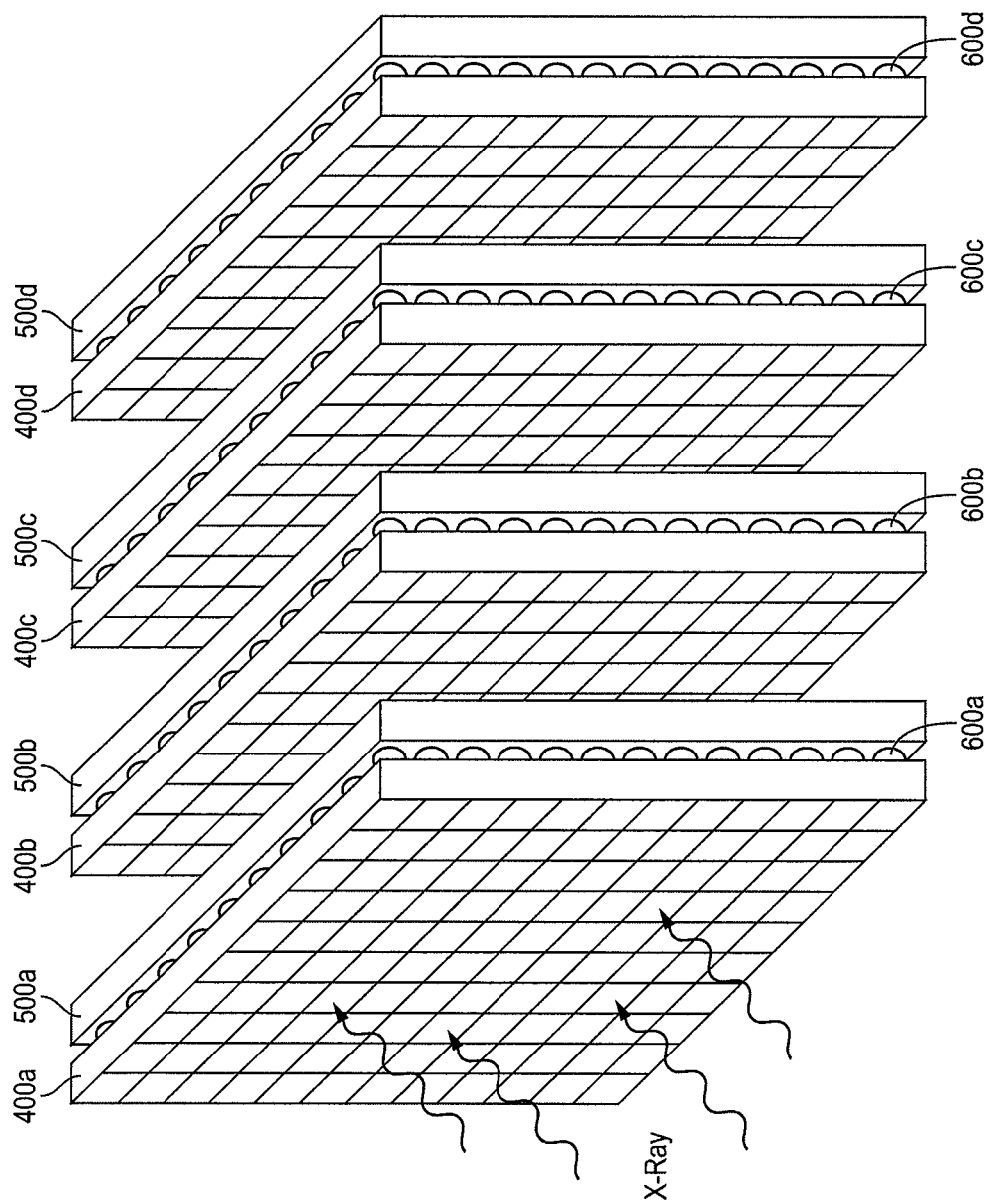
FIG. 5 is an exploded perspective view of a 4H X-ray camera according to another embodiment of the present invention, with a multiple layer extension of FIG. 1.

FIG. 5 is an exploded perspective view of a 4H X-ray camera according to another embodiment of the present invention, with a multiple layer (or multi-tiered) extension of FIG. 1. The 4H X-ray camera of FIG. 1 includes a plurality of tiers of sensors. Each tier includes at a sensor 400a, 400b, 400c, or 400d (e.g., a high speed sensor), readout electronic 500a, 500b, 500c, or 500d, (e.g., high-speed readout electronics), and bump bonding 600a, 600b, 600c, or 600d. A first tier includes first sensor 400a, first readout electronic 500a, and first bump bonding 600a. A second tier includes second sensor 400b, second readout electronic 500b, and second bump bonding 600b. A third tier includes third sensor 400c, third readout electronic 500c, and third bump bonding 600c. A fourth tier includes fourth sensor 400d, fourth readout electronic 500d, and fourth bump bonding 600d.

According to the embodiment of FIG. 1, within the first tier, the sensor 400a may be coupled to the readout electronics 500a utilizing the bump bonding 600a as solder (e.g., indium or other metals), but the present invention is not limited thereto, and any suitable connecting method may be used to connect the sensor 400a to the readout electronics 500a. The other tiers may be connected in the same or a similar manner.

The top sensors may be high speed, high atomic number (Z), high spatial resolution sensors and the second sensors may be a low-Z sensor.

According to an embodiment, each of the high speed, high atomic number (Z), high spatial resolution sensors may be coupled to the high speed readout electronics, within each of the tiers, utilizing 3D integration technologies (e.g., see 3D integration technologies offered by Tezzaron Semiconductor Corporation).

As shown in FIG. 5, the sensor 400a may be coupled to the readout electronics 500a are in-line with each other and each of the tiers is in-line with each other tier.

Figure 6:
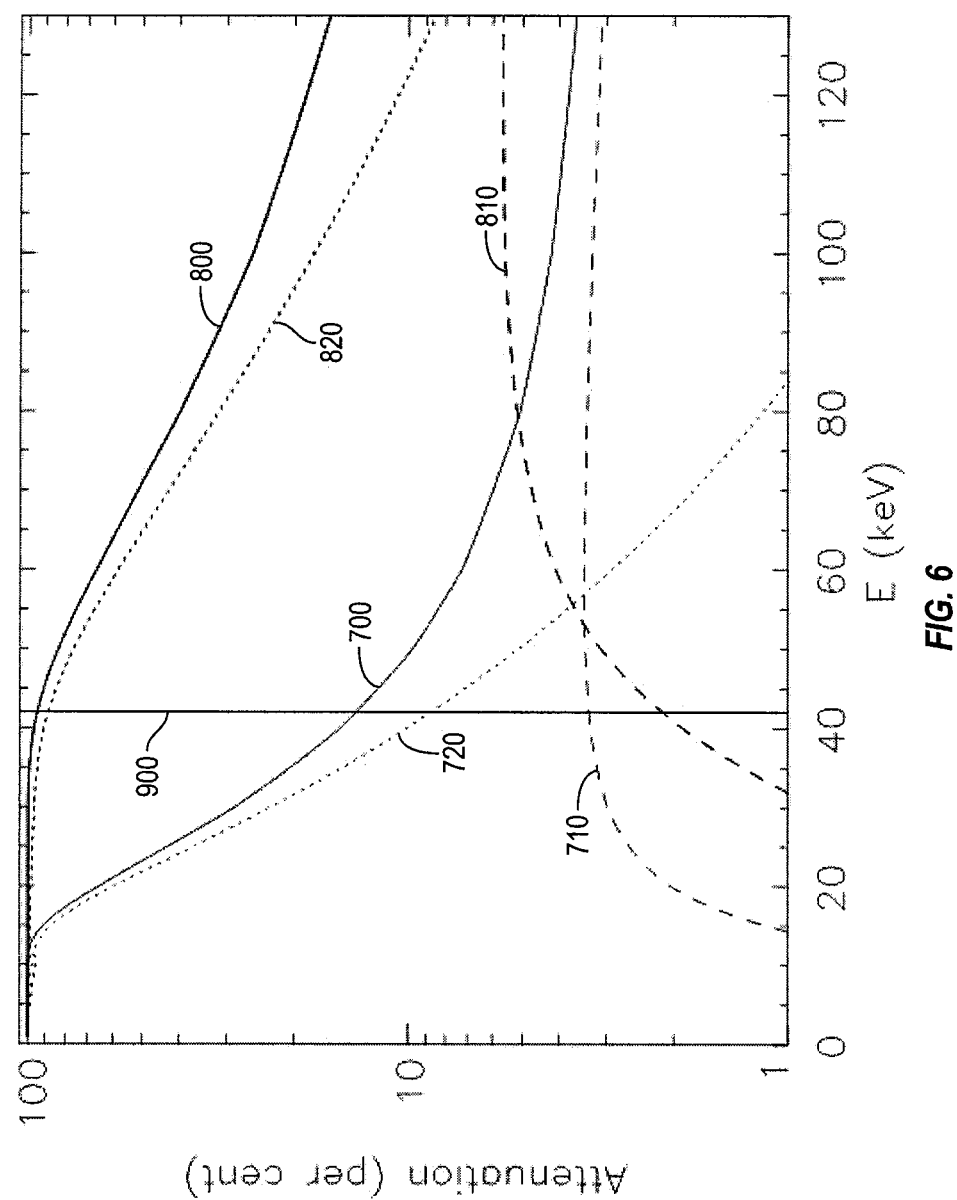
FIG. 6 shows a graph illustrating a comparison of X-ray energy-dependent attenuation due to photoelectric absorption (PE), incoherent (Compton) scattering and total scattering (the sum of PE, incoherent and coherent scattering) in Si and GaAs sensors.
Figure 7:
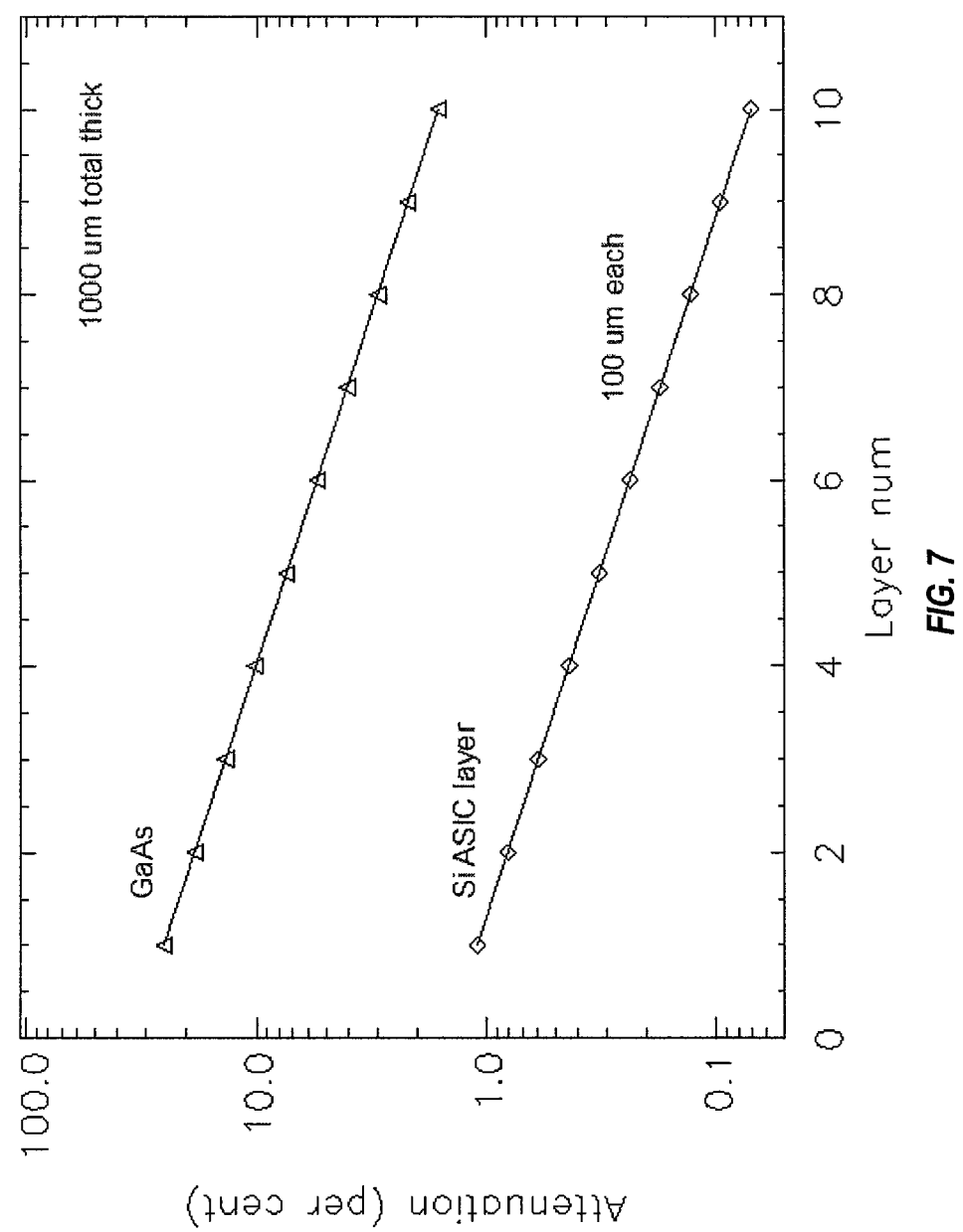
FIG. 7 shows a graph of X-ray attenuation in each layer for a 4-layer detector structure with GaAs sensor (250 μm thick) bonded to an ASIC.
Figure 8:
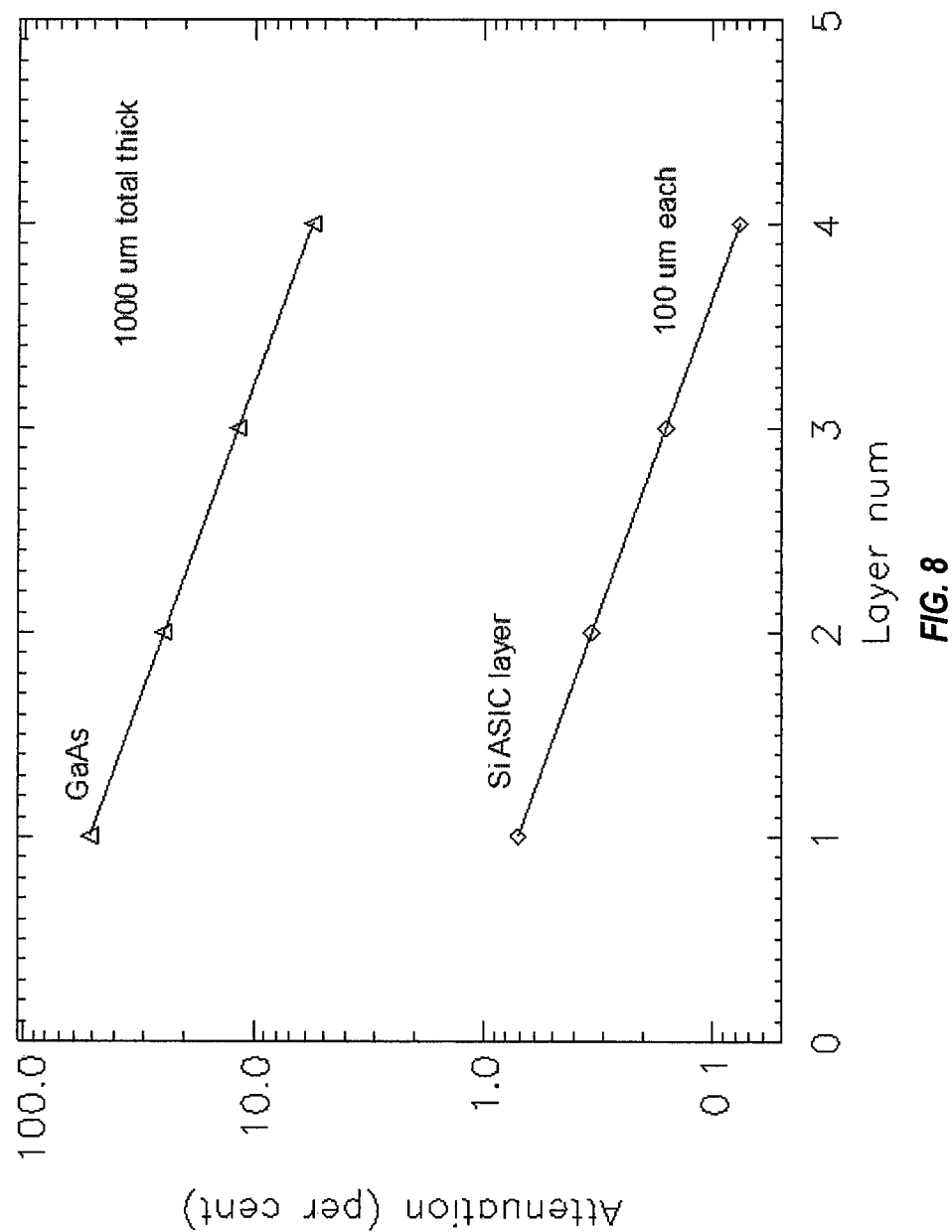
FIG. 8 shows a graph of X-ray attenuation in each layer for a 10-layer detector structure with GaAs sensor (100 μm thick) bonded to ASIC, which is assumed to be mostly Si of 100 μm thick.

FIG. 6 shows a graph illustrating a comparison of X-ray energy-dependent attenuation due to photoelectric absorption (PE), incoherent (Compton) scattering and total scattering (the sum of PE, incoherent and coherent scattering) in Si and GaAs sensors. FIG. 7 shows a graph of X-ray attenuation in each layer for a 4-layer detector structure with GaAs sensor (250 μm thick) bonded to an ASIC. FIG. 8 shows a graph of X-ray attenuation in each layer for a 10-layer detector structure with GaAs sensor (100 μm thick) bonded to ASIC, which is assumed to be mostly Si of 100 μm thick. The vertical axes of FIGS. 6-8 are logarithmic scales.

Referring to FIGS. 6-8, material characterization and discoveries on the mesoscale require both an intense source of penetrating illumination and detectors that can effectively capture the signals. In X-ray free electron lasers (XFELs), relativistic electrons self-organize into a regular spatial distribution when moving through a long undulator and emit coherent X-rays at the end. Several features of XFELs have made them useful in structure determination of polycrystalline and non-periodic materials. For example, the energies of photons exceed a few keV that allow 3D structure determination (in contrast to 2D surface imaging); the number of photons reaches $10^{12}$ to $10^{13}$ per pulse ($10^{10}$-$10^{11}$ photons per $\mu m^2$); individual photon pulses last a few to 100 fs that remove motion blur due to thermal or ballistic atomic motion; and transverse coherent length is comparable to X-ray absorption length, which can be 10's of microns.

Two-dimensional (2D) hybrid pixelated area detectors (PADs) are among the most widely used detector architectures so far in XFEL applications. Examples of 2D hybrid PADs include CS-PAD, AGIPD, Keck PAD, LPD, JUNGFRAU, and others. A pixelated semiconductor X-ray sensor (front end) is bonded to a pixelated application specific integrated circuit (ASIC) back end in a 2D hybrid PAD. X-rays produce electron-hole pairs in the semiconductor sensor. The induced electric charge are collected from the front end as signals and turned into digital signals by the ASIC. The hybrid architectures allow flexible selections of sensors and ASIC to meet different detection needs in XFEL experiments ranging from photon counting, spectroscopy, imaging, to their combinations such as spectroscopic imaging. Although the sensor selection has been tilted towards high-resistivity silicon, larger atomic number (Z) sensors such as GaAs:Cr and CdTe have seen increased uses in particular in synchrotron facilities. The highest XFEL photon energy is currently below 30 keV and silicon sensor may be sufficient. Some other salient features of 2D hybrid X-ray imagers include large dynamic range, good signal-to-noise/contrast, fast data processing, digital data output, compatibility with industrial CMOS, and bonding processes. Steady advances in scalable, low-cost bonding technologies also favor 2D hybrid PAD development. One of the notable development is the low-temperature direct bonding interconnect (DBI) technology that allows pixel pitch below 10 micron, or a bonding density exceeding 1 million connections per square centimeter by Ziptronix (recently acquired by Tessera Technologies, Inc.).

Embodiments of the present invention provide a '4H' camera based on 2D hybrid architecture. According to some embodiments, the high-Z sensor may be GaAs:Cr developed by Tomsk State University (TSU). According to some embodiments, the proposed ASICs may be based on the ePix family of integrated circuits under development by SLAC. Other existing ASICs may also be used.

In related art, the use of silicon sensors for high-energy photons (42 keV and above) may be emphasized. Due to the combination of Compton scattering physics for high-energy X-ray photons in silicon, the simultaneous requirements of high detection efficiency and high speed, single-photon counting (SPC) mode of detection may be used. To achieve SPC mode in XFELs requires silicon sensor thickness to be below 100 μm and even thinner ASICs to minimize the attenuation of X-rays in the ASICs.

In FIG. 6, the total attenuation percentage (as a function of energy, keV) 700 for a Si sensor is a sum of the Compton scattering 710 and the photoelectric absorption (PE) 720. Further, the total attenuation percentage (as a function of energy, keV) 800 for a GaAs sensor is a sum of the Compton scattering 810 and the PE 820.

As shown in FIG. 6, Compton scattering fraction 810 in GaAs is less than 5% for photon energies less than 80 keV and the X-ray attenuation 800 is dominated by photoelectric absorption (PE) 820. This allows the design of multilayer stacked detector configuration that operates in the integration (INT) mode (see FIG. 5), which may be similar to the existing 2D hybrid PADs utilizing silicon. A comparison of the N-layer stacked design with a single-layer design is summarized in Table 1 below.

TABLE 1

| Parameters | Single-layer | N-layer |
| --- | --- | --- |
| Sensor thickness per layer | $T_0$ | $T_0/N$ |
| Sensor response time | $T_0/u_d$ | $T_0/Nu_d$ |
| Dynamic range | $N_0$ | $N_0/N$ |
| Plasma effect | $\propto N_0$ | $\propto N_0/N$ |
| Full depletion bias | $V_0$ | $\geq V_0/N$ |
| Spatial resolution | pixel size | pixel size |
| Radiation hardness | excellent | excellent |
| Dark pixels | Md | NMd |
| Bonding | solder bumps/DBI | DBI preferred |

Table 1 shows a comparison of a single-layer with an N-layer 2D hybrid detector. $N_0$ is the number of X-ray photons. $u_d$ is a characteristic charge drift time. $M_d$ is the number of dark pixels for a single-layer camera.

Two multilayer stacked configurations with a fixed total GaAs thickness of 1000 μm are compared in FIGS. 6-8. The configuration of FIG. 8 corresponds to an individual GaAs sensor thickness of 250 μm. The configuration of FIG. 7 corresponds to an individual GaAs sensor thickness of 100 μm. In both cases, the total GaAs thickness is fixed at 1000 μm, which gives more than 50% of X-ray attenuation for photon energies exceeding 60 keV.

Relatively thick ASIC layer (assumed to be primarily silicon) of around 100 μm thick may be used. This is due to the large discrepancies in X-ray attenuation in Si and in GaAs. The full X-ray attenuation in Si ASIC is less than 5% in both cases.

Since we have assumed constant GaAs sensor thickness for different layers in FIGS. 6-8, the amount of X-ray collected in the first layer is several times the second layer and so forth. In practice, layer thicknesses may be adjusted for different layers to allow comparable X-ray absorption for each layer or $N_0/N$ photons per layer as listed in Table 1. There are advantages to do so. For example, the X-ray induced signals in each layer will be better matched to the dynamic range of the ADC and allow reduced ADC dynamic range in each layer.

Pixelated sensors based on chromium compensated gallium arsenide (GaAs:Cr) may be utilized for high-energy X-ray imaging [10-12]. Detector-grade GaAs:Cr materials were obtained from low-resistivity gallium arsenide (n-GaAs) compensated with Cr atoms utilizing high-temperature annealing. Chromium atoms, which are deep acceptors, diffuse in n-GaAs and compensate both shallow and deep (EL2-centers) donors. As a result, high-resistivity GaAs:Cr are formed with highly uniform resistivity distribution and uniform electric field distribution across the full sensor thickness. The GaAs:Cr processing technology developed by TSU allows sensor thickness up to 1 mm while maintaining resistivity of about $10^9$ Ohm·cm. Compared to semi-insulating (SI) liquid encapsulated Czochralski (LEC) GaAs sensors, in which fluctuations of count rate are observed due to instability of electric field, GaAs:Cr sensors by TSU can maintain more stable count rate. This property permits the use of simple methods of flat field correction to obtain high quality X-ray images, which has been confirmed experimentally.

GaAs:Cr PADs have also been demonstrated utilizing HEXITEC and Medipix3RX ASICs. The energy resolution (full width half maximum) for 60 keV photons is about 3 keV. It was shown that radiation hardness of GaAs:Cr sensors irradiated with 12 keV X rays exceeds 300 Mrad. Further, there are no polarization effects in GaAs:Cr sensors if the photon flux density is in the range of $9 \times 10^7$ to $1.5 \times 10^{10}$ photons/(s·mm$^2$), which compares favorably with Cd(Zn)Te sensors.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

A relevant device or component (or relevant devices or components) according to embodiments of the present invention described herein may be implemented utilizing any suitable hardware (e.g., an application-specific integrated circuit), firmware (e.g., a DSP or FPGA), software, or a suitable combination of software, firmware, and hardware. For example, the various components of the relevant device (s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device utilizing a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

Although this invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A 4H X-ray camera comprising:
a high speed, high atomic number (Z), high spatial resolution sensor for sensing X-rays having energy over 30 keV coupled with a low Z sensor; and
high speed readout electronics,
wherein the high speed, high atomic number (Z), high spatial resolution sensor is coupled to the high speed readout electronics,
wherein the high speed, high atomic number (Z), high spatial resolution sensor and the high speed readout electronics are in a same plane of incidence of incoming X-rays and the high speed readout electronics are spaced from the high speed, high atomic number (Z) high spatial resolution sensor in the same plane, and
wherein the high speed, high atomic number (Z), high spatial resolution sensor is different in thickness from the low Z sensor.

2. The 4H X-ray camera of claim 1, wherein the high speed, high atomic number (Z), high spatial resolution sensor comprises high-resistivity Chromium-doped GaAs sensor arrays.

3. The 4H X-ray camera of claim 1, wherein the high speed readout electronics comprises nano-second Application Specific Integrated Circuits (ASICs).

4. The 4H X-ray camera of claim 1, wherein the high speed, high atomic number (Z), high spatial resolution sensor is coupled to the high speed readout electronics utilizing bump bonding.

5. The 4H X-ray camera of claim 1, wherein the high speed, high atomic number (Z), high spatial resolution sensor is coupled to the high speed readout electronics utilizing wire bonding.

6. The 4H X-ray camera of claim 1, wherein the high speed, high atomic number (Z), high spatial resolution sensor is coupled to the high speed readout electronics utilizing 3D integration technology.

7. The 4H X-ray camera of claim 1, wherein the high speed, high atomic number (Z), high spatial resolution sensor comprises a material with at least one element with an atomic number greater than thirty.

8. The 4H X-ray camera of claim 1, further comprising:
a second sensor in line with the high speed, high atomic number (Z), high spatial resolution sensor, the second sensor being the low Z sensor,
wherein the high speed readout electronics are divided into four parts, each part being coupled to a respective half of one of the high speed, high atomic number (Z), high spatial resolution sensor or the second sensor.

9. The 4H X-ray camera of claim 8, further comprising:
a first tier comprising the high speed, high atomic number (Z), high spatial resolution sensor, the second sensor, and the high speed readout electronics; and
a second tier comprising a third sensor, a fourth sensor, and second high speed readout electronics, the third sensor and the fourth sensor being in line with the high speed, high atomic number (Z), high spatial resolution sensor and the second sensor.

10. A 4H X-ray camera comprising:
a plurality of tiers, each tier comprising:
a high speed, high atomic number (Z), high spatial resolution sensor for sensing X-rays having energy over 30 keV coupled with a low Z sensor; and
high speed readout electronics, the high speed readout electronics being spaced from the high speed, high atomic number (Z) high spatial resolution sensor in a same plane,
wherein the high speed, high atomic number (Z), high spatial resolution sensor is coupled to the high speed readout electronics, and
wherein the low Z sensor is located to sense incoming X-rays after the incoming X-rays pass through the high speed, high atomic number (Z), high spatial resolution sensor.

11. The 4H X-ray camera of claim 10, wherein the high speed, high atomic number (Z), high spatial resolution sensor is coupled to the high speed readout electronics utilizing 3D integration technology.

12. The 4H X-ray camera of claim 10, wherein each of the high speed, high atomic number (Z), high spatial resolution sensors comprises high-resistivity Chromium-doped GaAs sensor arrays.

13. The 4H X-ray camera of claim 10, wherein each of the high speed readout electronics comprises nano-second Application Specific Integrated Circuits (ASICs).

14. The 4H X-ray camera of claim 10, wherein each of the high speed, high atomic number (Z), high spatial resolution sensors comprises a material with at least one element with an atomic number greater than thirty.

15. The 4H X-ray camera of claim 10, wherein each of the tiers further comprises:
a second sensor in line with the high speed, high atomic number (Z), high spatial resolution sensor, the second sensor being the low Z sensor,
wherein the high speed readout electronics, of each of the tiers, is divided into four parts, each part being coupled to a respective half of one of the high speed, high atomic number (Z), high spatial resolution sensor or the second sensor, the high speed, high atomic number (Z), high spatial resolution sensor and each of the four parts of the high speed readout electronics of each tier being in a same plane of incidence of incoming X-rays.

16. The 4H X-ray camera of claim 15, wherein the high speed, high atomic number (Z), high spatial resolution sensor and the second sensor are coupled to the high speed readout electronics, within each of the tiers, utilizing transmission lines.

17. The 4H X-ray camera of claim 10,
wherein the high speed, high atomic number (Z), high spatial resolution sensor, in each of the tiers, is in-line with its corresponding high speed readout electronics, and
wherein each of the plurality of tiers is in-line with each other of the plurality of tiers.

18. The 4H X-ray camera of claim 17, wherein each of the high speed, high atomic number (Z), high spatial resolution sensors is 100 µm thick.

19. The 4H X-ray camera of claim 17, wherein each of the high speed readout electronics is 100 µm thick.

20. A method of capturing an X-ray image utilizing a 4H X-ray camera, the method comprising:
receiving an X-ray with energy over 30 keV at a high speed, high atomic number (Z), high spatial resolution sensor coupled with a low Z sensor of the 4H X-ray camera;
generating and transferring an electric signal from the high speed, high atomic number (Z), high spatial resolution sensor coupled with the low Z sensor to high speed readout electronics of the 4H X-ray camera; and
generating an image based on the electric signal received at the high speed readout electronics,
wherein the image has a resolution having a pixel size of 200 microns or less,
wherein an operating speed of the 4H X-ray camera is 100 MHZ or greater,
wherein the high speed, high atomic number (Z), high spatial resolution sensor comprises a material with an atomic number greater than thirty, and
wherein the high speed, high atomic number (Z), high spatial resolution sensor and the high speed readout electronics are in a same plane of incidence of incoming X-rays and the high speed readout electronics are spaced from the high speed, high atomic number (Z) high spatial resolution sensor in the same plane.

* * * * *